US012689186B2

(12) United States Patent
Wei et al.

(10) Patent No.: US 12,689,186 B2
(45) Date of Patent: Jul. 21, 2026

(54) LASER MODULE WITH BEAM ROTATOR

(71) Applicant: Lumentum Operations LLC, San Jose, CA (US)

(72) Inventors: Cailin Wei, San Jose, CA (US); John G. Bai, San Jose, CA (US); Jihua Du, San Jose, CA (US); Prasad Yalamanchili, San Jose, CA (US); Victor Rossin, Mountain View, CA (US)

(73) Assignee: Lumentum Operations LLC, San Jose, CA (US)

( * ) Notice: Subject to any disclaimer, the term of this patent is extended or adjusted under 35 U.S.C. 154(b) by 794 days.

(21) Appl. No.: 18/062,915

(22) Filed: Dec. 7, 2022

(65) Prior Publication Data

US 2023/0178966 A1      Jun. 8, 2023

Related U.S. Application Data

(60) Provisional application No. 63/265,112, filed on Dec. 8, 2021.

(51) Int. Cl.
H01S 5/40 (2006.01)
G02B 27/09 (2006.01)
(Continued)

(52) U.S. Cl.
CPC ........ H01S 5/4012 (2013.01); G02B 27/0905 (2013.01); G02B 27/0922 (2013.01);
(Continued)

(58) Field of Classification Search
CPC .. H01S 5/4012; H01S 5/4025; H01S 5/02251; H01S 5/02255
See application file for complete search history.

(56) References Cited

U.S. PATENT DOCUMENTS 5,465,263 A * 11/1995 Bour .......................... B41J 2/45
372/50.12
2009/0245315 A1* 10/2009 Faybishenko ........ G02B 6/4214
372/50.12
(Continued)

FOREIGN PATENT DOCUMENTS

CN          112652950 A * 4/2021 ........... H01S 3/0941

OTHER PUBLICATIONS

Yu_English1 (Year: 2021).*
(Continued)

*Primary Examiner* — Minsun O Harvey
*Assistant Examiner* — Alexander Ehrlich
(74) *Attorney, Agent, or Firm* — Harrity & Harrity, LLP

(57) ABSTRACT

A laser module includes a laser submodule, a polarization beam combiner (PBC), a beam rotator, a grating, and an output fiber (e.g., each disposed on an internal surface of a floor of the laser module). The laser submodule is configured to emit an array pattern of beams, which the PBC is configured to combine into a vertical stack pattern of beams, which the beam rotator is configured to rotate into a horizontal stack pattern of beams, which the grating is configured to combine into an overlapped pattern of beams, which the output fiber is configured to emit. The vertical stack pattern of beams, the horizontal stack pattern of beams, and the overlapped pattern of beams are to transmit through the laser module parallel to a single common plane (e.g., that is parallel to the internal surface of the floor of the laser module).

20 Claims, 4 Drawing Sheets

(51) Int. Cl.

| | |
|---|---|
| *G02B 27/28* | (2006.01) |
| *H01S 5/02251* | (2021.01) |
| *H01S 5/02315* | (2021.01) |
| *H01S 5/02325* | (2021.01) |

(52) U.S. Cl.
CPC ..... *G02B 27/0944* (2013.01); *G02B 27/0955* (2013.01); *G02B 27/0977* (2013.01); *G02B 27/285* (2013.01); *G02B 27/286* (2013.01); *H01S 5/02251* (2021.01); *H01S 5/02315* (2021.01); *H01S 5/02325* (2021.01); *H01S 5/4025* (2013.01)

(56) References Cited

U.S. PATENT DOCUMENTS

2019/0305517 A1* 10/2019 Dejima ................ G02B 5/0278
2023/0352913 A1* 11/2023 Kasai ................... H01S 5/4012

OTHER PUBLICATIONS

Jay Skidmore, et al.; "Advances in high-power 9XXnm laser diodes for pumping fiber lasers"; High-Power Diode Laser Technology and Applications XIV; Proc. of SPIE; 2016; 7 pages; vol. 9733, 97330B; SPIE.

Robin K. Huang, et al.; "TeraDiode's high brightness semiconductor lasers"; Components and Packaging for Laser Systems II; Proc. of SPIE; 2015; 9 pages; vol. 9730, 97300C; SPIE.

Stefan Hengesbach, et al.; "Simultaneous Frequency Stabilization and High-Power Dense Wavelength Division Multiplexing (HP-DWDM) using an External Cavity based on Volume Bragg Gratings (VBGs)"; High-Power Diode Laser Technology and Applications XIV; Proc. of SPIE; 15 pages; vol. 9733, 97330K; SPIE.

J. Witte, et al.; "Compact 35 μm Fiber Coupled Diode Laser Module Based on Dense Wavelength Division Multiplexing of NBA Mini-Bars"; High-Power Diode Laser Technology and Applications XIV; Proc. of SPIE; 2016; 12 pages; vol. 9733, 97330H; SPIE.

* cited by examiner

1

LASER MODULE WITH BEAM ROTATOR

CROSS-REFERENCE TO RELATED APPLICATION

This Patent Applications claims priority to U.S. Patent Application No. 63/265,112, filed on Dec. 8, 2021, and entitled "WAVELENGTH LOCKED, HIGH BRIGHTNESS, HIGH POWER LASER MODULE USING BEAM ROTATOR" The disclosure of the prior Application is considered part of and is incorporated by reference into this Patent Application.

TECHNICAL FIELD

The present disclosure relates generally to a laser module and to a laser module with a beam rotator.

BACKGROUND

An optical amplifier is a device that is to receive signal light and generate amplified signal light (e.g., signal light with comparatively higher optical power). Typically, the optical amplifier provides optical amplification using a so-called gain medium, which is "pumped" (e.g., provided with energy) by a source, such as a pump laser.

SUMMARY

In some implementations, a laser module comprises: a laser submodule attached to an internal surface of a floor of the laser module; a polarization beam combiner (PBC) attached to the internal surface of the floor; a beam rotator attached to the internal surface of the floor; a first lens attached to the internal surface of the floor; a reflector attached to the internal surface of the floor; a grating attached to the internal surface of the floor; a second lens attached to the internal surface of the floor; a third lens attached to the internal surface of the floor; and an output fiber attached to the internal surface of the floor, wherein: the laser submodule includes a plurality of laser diodes arranged in a row-and-column formation, wherein each laser diode, in a row of the row-and-column formation, is configured to emit a beam associated with a same particular wavelength, the laser submodule is configured to emit an array pattern of beams having different polarizations to the PBC, the PBC is configured to combine the array pattern of beams into a vertical stack pattern of beams, the beam rotator is configured to rotate the vertical stack pattern of beams into a horizontal stack pattern of beams, the first lens and the reflector are configured to direct the horizontal stack pattern of beams to the grating, the grating is configured to combine the horizontal stack pattern of beams into an overlapped pattern of beams and to direct the overlapped pattern of beams to the second lens, the second lens is configured to direct the overlapped pattern of beams to the third lens, the third lens is configured to direct the overlapped pattern of beams to the output fiber, and the vertical stack pattern of beams, the horizontal stack pattern of beams, and the overlapped pattern of beams are to transmit through the laser module parallel to the internal surface of the floor of the laser module.

In some implementations, a laser module comprises: a laser submodule attached to an internal surface of a floor of the laser module; a PBC attached to the internal surface of the floor; a beam rotator attached to the internal surface of the floor; a grating attached to the internal surface of the floor; and an output fiber attached to the internal surface of the floor, wherein: the laser submodule is configured to emit an array pattern of beams having different polarizations to the PBC, the PBC is configured to combine the array pattern of beams into a vertical stack pattern of beams, the beam rotator is configured to rotate the vertical stack pattern of beams into a horizontal stack pattern of beams, the grating is configured to combine the horizontal stack pattern of beams into an overlapped pattern of beams and to direct the overlapped pattern of beams to the output fiber, and the output fiber is configured to emit the overlapped pattern of beams from the laser module and to a target, and the vertical stack pattern of beams, the horizontal stack pattern of beams, and the overlapped pattern of beams are to transmit through the laser module parallel to the internal surface of the floor of the laser module. In some implementations, a laser module comprises: a laser submodule attached to an internal surface of a floor of the laser module; a PBC attached to the internal surface of a floor of the laser module; a beam rotator attached to the internal surface of the floor; and a grating attached to the internal surface of the floor, wherein: the laser submodule is configured to emit an array pattern of beams having different polarizations to the PBC, the PBC is configured to combine the array pattern of beams into a vertical stack pattern of beams, the beam rotator is configured to rotate the vertical stack pattern of beams into a horizontal stack pattern of beams, the grating is configured to combine the horizontal stack pattern of beams into an overlapped pattern of beams and to direct the overlapped pattern of beams to an output fiber of the laser submodule, and the vertical stack pattern of beams, the horizontal stack pattern of beams, and the overlapped pattern of beams are to transmit through the laser module parallel to the internal surface of the floor of the laser module.

DETAILED DESCRIPTION

Figure 1A:
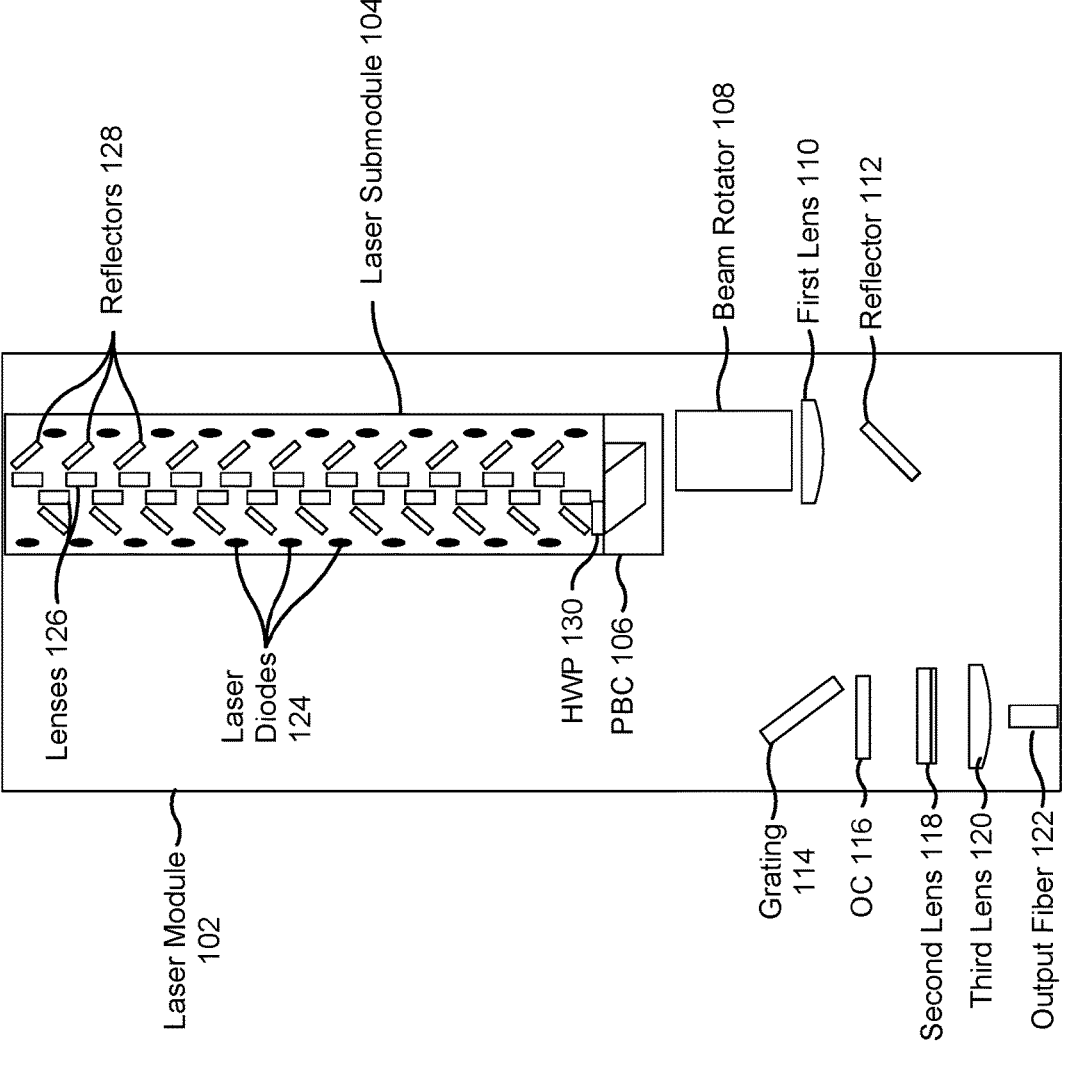
FIGS. 1A-1C are diagrams of an example implementation described herein.

The following detailed description of example implementations refers to the accompanying drawings. The same reference numbers in different drawings may identify the same or similar elements.

There is an increasing desire for pump lasers with locked wavelengths, higher brightness, and higher power to pump high power (e.g., kilowatt (kW)-class) fiber lasers. Such high power fiber lasers enable material processing applications, such as metal cutting, welding, brazing, and marking that cannot be accomplished using low-powered (e.g., less than kW-class) fiber lasers. In many cases, high power fiber lasers have narrow absorption bands, and are therefore difficult to implement in practice because conventional non-locked multimode pump lasers have an emission spectrum that is broader than the absorption band. For example, an Ytterbium (Yb)-doped active fiber laser has a narrow high absorption peak at 976 nanometers (nm), and a Yb:Yttrium Aluminum Garnet (YAG) fiber laser has a narrow high absorption peak at 969 nm. Therefore, wavelength locking is desired for pump lasers to enable high power fiber lasers to operate in a narrow wavelength range. Further, pump lasers with higher power (e.g., power that is greater than 100 watts (W)) are desired to decrease the number of pump lasers that are needed to be included in a high power fiber laser (e.g., to reduce a design complexity of the high power fiber laser, such as by reducing a channel count needed for pump combiners). Additionally, in many cases, a fiber laser with high brightness is desired, such as to enable processing of hard-to-process materials with a smooth finish.

Typically, to increase power of a pump laser, a package of the laser module is designed to multiplex multi-chip light beams from diode lasers into a single fiber, using, for example, space division multiplexing, polarization beam combining, or wavelength beam combining. When space division multiplexing is used, laser diode chips can be combined to couple light beams into a fiber, but a numerical aperture (NA) of the incoming beam increases with the number of laser diode chips. That is, the greater the number of laser diode chips, the greater the incident angles of the light beams on a receiving end of the fiber and therefore the greater the NA. This degrades a beam quality of the combined beam, which affects its ability to be used for material processing applications.

Some implementations described herein provide a laser module (e.g., a package for a pump laser). The laser module includes a laser submodule, a polarization beam combiner (PBC), a beam rotator, a first lens, a reflector, a grating, an output coupler (OC), a second lens, a third lens, and an output fiber. The laser submodule includes a plurality of laser diodes (e.g., arranged in a row-and-column formation, such as on a "staircase" structure) that emit a plurality of beams in an array pattern of beams. For example, the array pattern of beams may include a first column of beams (e.g., associated with a first polarity, such as a vertical polarity) and a second column of beams (e.g., associated with a second polarity, such as a horizontal polarity). A row of beams (e.g., two beams in a row), of the array pattern of beams, may be associated with a same wavelength (e.g., the row of beams may be centered at the same wavelength), such as after wavelength locking.

The PBC combines (e.g., spatially combines, such as by using space division multiplexing) the two columns of beams (e.g., that are in different polarization directions) into one column in a vertical stack pattern of beams. The beam rotator rotates the vertical stack pattern of beam into a horizontal stack pattern of beams. The first lens and the reflector direct the horizontal stack pattern of beams to the grating, which combines (e.g., spatially combines) the horizontal stack pattern of beams into an overlapped pattern of beams. This creates a single beam (e.g., achieved by wavelength beam combining (WBC)) and therefore enables the single beam to have high power (e.g., a combination of respective powers of the plurality of light beams).

The OC reflects a first portion (e.g., a small portion, such as less than 10%) of the overlapped pattern of beams back to the plurality of laser diodes of the laser submodule, thereby causing the plurality of laser diodes to be wavelength-locked, and directs a second portion (e.g., a large portion, such as greater than 90%) of the overlapped pattern of beams (e.g., as a single beam) to the second and third lenses, which focuses the overlapped pattern of beams in vertical and horizontal directions respectively (e.g., as the single beam) on the output fiber. The output fiber emits the second portion of the overlapped pattern of beams (e.g., as the single beam), and thereby emits the optical power of the second portion of the overlapped pattern of beams to a target. The target may be, for example, another fiber (e.g., of a fiber laser), a workpiece (e.g., associated with a laser processing task, such as cutting, drilling, welding, brazing, surface annealing, alloying, and/or hardening), or another type of target. Accordingly, because a spatial spread of the second portion of the overlapped pattern of beams, as a single beam, is reduced (e.g., as compared to a spatial spread of the plurality of beams in the horizontal stack pattern of beams and/or the vertical stack pattern of beams), an NA of the single beam is reduced (e.g., as compared to a typical configuration for multiplexing multi-chip optical beams into a single fiber). This, therefore, increases a brightness of the single beam that transmits through and emits from the output fiber (e.g., as compared to a typical multiplexed beam from a same number of diodes but having a larger NA).

Further, the plurality of light beams may transmit, within the laser module and in the array pattern of beams, the vertical stack pattern of beams, the horizontal stack pattern of beams, and the overlapped pattern of beams (e.g., as a single beam), parallel to an internal surface of a floor of the laser module. Accordingly, components of the laser module (e.g., the laser submodule, the PBC, the beam rotator, the first lens, the reflector, the grating, the OC, the second lens, and the output fiber) may be arranged within the laser module on the internal surface of the floor of the laser module (and no other internal surface of the laser module, such as an internal surface of a ceiling or a side wall of the laser module). This reduces a design complexity and a manufacturing complexity of the laser module, such as in terms of component alignment and thermal management (e.g., because heat generated by the components has to be managed only via the internal surface of the floor of the laser module, as opposed to multiple internal surfaces).

In particular, the beam rotator enables the plurality of beams to be directed to the grating so that the grating can overlap the plurality of light beams (e.g., that are in the horizontal stack pattern of beams) to create the overlapped pattern of beams as a single beam, such that the single beam transmits parallel to the internal surface of floor of the laser module. In other words, the beam rotator rotating the beams enables the grating to be attached to the internal surface of the floor of the laser module to thereby create the overlapped pattern of beams as the single beam that is parallel to the internal surface of the floor (e.g., the wavelength beam combining performed by the grating and the direction of travel of the single beam are parallel to the internal surface of the floor of the laser module). This would not be possible without a beam rotator because, without rotation of the plurality of beams, output from the grating is not parallel to the internal surface of the floor (e.g., at an angle away from parallel to the internal surface of the floor, which requires one or more other components to be arranged on another internal surface (e.g., of a side or a ceiling) of the laser module. This significantly increases design and thermal management complexity of the laser module. For example, at least one additional reflector would need to be arranged on another internal surface of the laser module, such as a ceiling of the laser module, to return the grating output parallel to the internal surface of the floor, or components between the grating and output fiber would have to be configured perpendicular (or in some other large angles) to the internal surface of the floor. The inclusion of a beam rotator decreases complexity of the laser module because all optical components and beam paths can be aligned in a single common plane.

In this way, some implementations described herein (e.g., by adding a beam rotator within a laser module) enables (e.g., simultaneously) wavelength locking of a beam emitted by the laser module (e.g., that is a combination of a plurality of beams), increased brightness of the beam, and increased power of the beam (e.g., as compared to a beam generated by multiplexing multi-chip optical beams). Moreover, generation of the beam is reliable (e.g., because components of the laser module are aligned in a single common plane).

Further, the grating of the package allows a stack of beams with different wavelengths to be overlapped into a single beam, which reduces beam divergence and enhances beam brightness of the beam. Accordingly, more rows of laser diodes can be added to the laser module to increase a power of the single beam, with minimal degradation to a quality of the single beam.

Figure 1B:
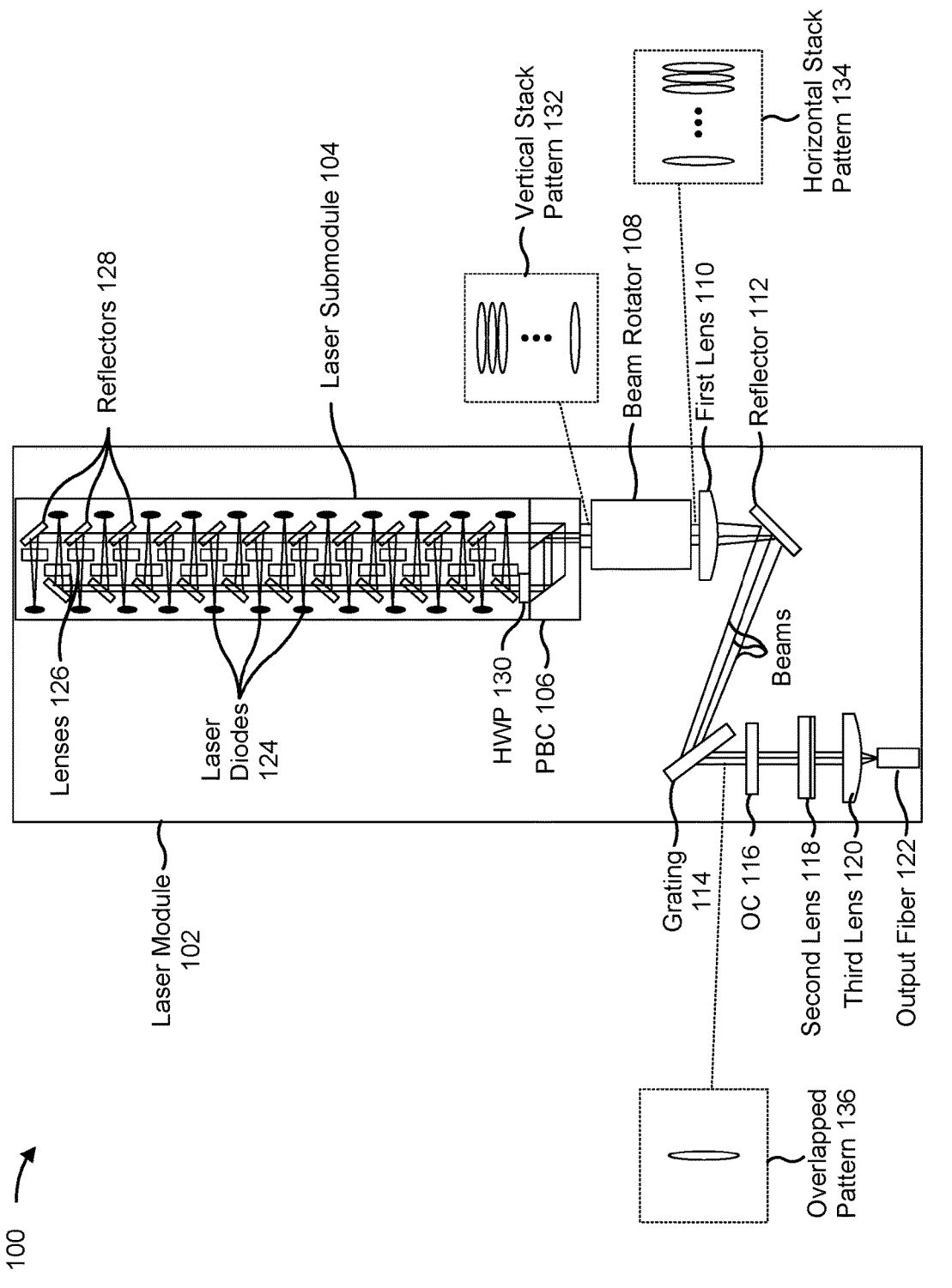
Figure 1C:
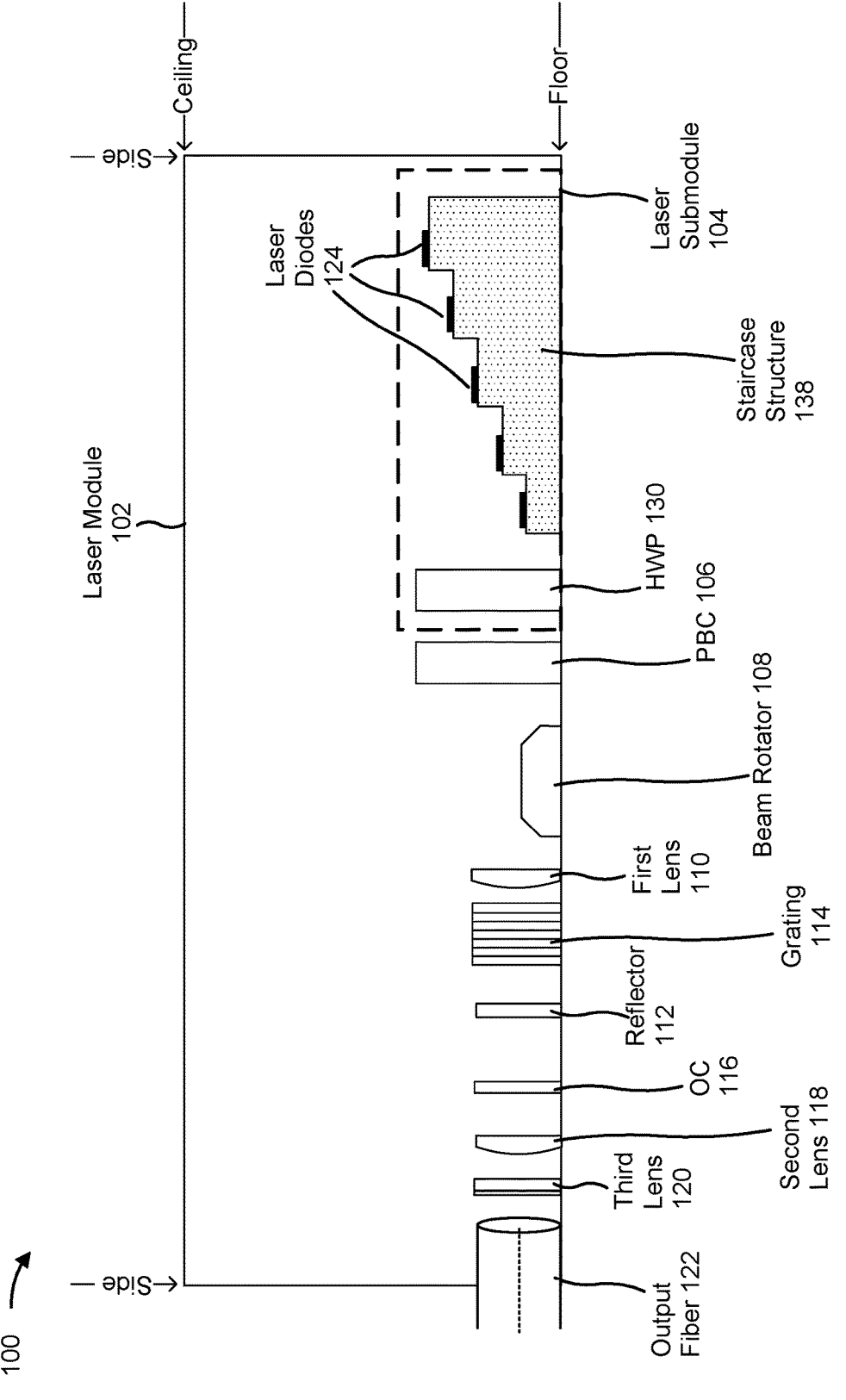

FIGS. 1A-1C are diagrams of an example implementation 100 described herein. As shown in FIGS. 1A-1C, the example implementation 100 may comprise a laser module 102, which may include a laser submodule 104, a PBC 106, a beam rotator 108, a first lens 110, a reflector 112, a grating 114, an OC 116, a second lens 118, a third lens 120, and/or an output fiber 122. FIG. 1A shows a top-down view of the laser module 102 (e.g., a top-down view of an internal environment of the laser module 102). FIG. 1B shows a top-down view of a propagation path of beams within the laser module 102. FIG. 1C shows a side view of the laser module 102 (e.g., a side view of the internal environment of the laser module 102).

The laser module 102 may include multiple elements that define the internal environment of the laser module 102. For example, the laser module 102 may include a floor, a ceiling (e.g., a lid), and one or more side walls that define the internal environment (e.g., by respective internal surfaces of the floor, the ceiling, and the one or more side walls). Each of the laser submodule 104, the PBC 106, the beam rotator 108, the first lens 110, the reflector 112, the grating 114, the OC 116, the second lens 118, the third lens 120, and/or the output fiber 122 may be disposed on an internal surface (e.g., a single internal surface) of the laser module 102. For example, as shown in FIGS. 1A-1B, each of the laser submodule 104, the PBC 106, the beam rotator 108, the first lens 110, the reflector 112, the grating 114, the OC 116, the second lens 118, the third lens 120, and/or the output fiber 122 may be disposed on an internal surface of the floor of the laser module 102.

The laser submount 104 is attached to the internal surface of the floor of the laser module 102. The laser submodule 104 may include a plurality of laser diodes 124. From the top-down view of the laser module 102, the plurality of laser diodes 124 may be arranged in a two-dimensional formation (e.g., a row-and-column formation) within the laser submodule 104. For example, the plurality of laser diodes 124 may be arranged in an N×2 row-and-column formation, where N≥2. In a specific example, as shown in FIGS. 1A-1B, the plurality of laser diodes 124 may be arranged in an 11×2 row-and-column formation. A row of laser diodes 124 (e.g., that includes two or more laser diodes 124) may be offset from another row of laser diodes 124 by a first distance (e.g., a pitch between rows may be the first distance) in a first direction (e.g., in a vertical direction as shown in FIG. 1A), and a column of laser diodes 124 (e.g., that includes two or more laser diodes 124) may be offset from another column of laser diodes 124 by a second distance (e.g. a pitch between columns may be the second distance) in a second direction (e.g., in a horizontal direction as shown in FIG. 1A). The first distance may be less than or equal to a first particular distance threshold (e.g., that is less than or equal to 1 millimeters (mm), 2 mm, and/or 3 mm), and the second distance may be less than or equal to a second particular distance threshold (e.g., that is less than or equal to 1 micrometer (μm), 5 μm, and/or 10 μm).

In some implementations, the plurality of laser diodes 124 may be arranged on a "staircase" structure, such that 2 laser diodes 124 that are associated with a row, of an N×2 row-and-column formation of the plurality of laser diodes 124, are arranged on a particular "step" of the staircase structure. Each step may be parallel to a particular plane, such as a horizontal plane (e.g., that is parallel to the internal surface of the floor of the laser module 102) and therefore, each laser diode 124 of the 2 laser diodes 124 in the row may have a height (e.g., measured as a distance from the internal surface of the floor) associated with the particular step (e.g., each laser diode 124 may have the same height as the particular step). In some implementations, each row of 2 laser diodes of an N×2 row-and-column formation of the plurality of laser diodes 124 may have a height that is different than respective heights of the other rows of the N×2 row-and-column formation of the plurality of laser diodes 124.

Each laser diode 124, of the plurality of laser diodes 124, may be configured to emit a beam (e.g., a laser beam) associated with a particular wavelength (e.g., centered at the particular wavelength, such as after being wavelength-locked as described herein). In some implementations, each laser diode 124, in a row of laser diodes 124, may be configured to emit a beam associated with a same particular wavelength. Each row of laser diodes 124 having a same particular wavelength may be advantageous for wavelength-locking the laser diodes 124 and for combining/separating the beams from that row by the PBC 106 and/or grating 114. For example, as shown in FIGS. 1A-1B, a first laser diode 124 (e.g., a left laser diode 124) and a second laser diode 124 (e.g., a right laser diode 124) in a row may each be configured to emit a beam associated with the same particular wavelength. In some implementations, each laser diode 124, of the plurality of laser diodes 124, may be configured to be wavelength-locked at a particular wavelength at which the laser diode is configured to emit a beam (e.g., due to a portion of the beam that is reflected back to the laser diode 124, such as by the OC 116, as further described herein). Additionally, a wavelength difference between adjacent rows of laser diodes 124 may satisfy (e.g., be less than or equal to) a wavelength difference threshold. For example, a first row of laser diodes 124 may be configured to emit a first wavelength and a second, adjacent, row of laser diodes 124 may be configured to emit a second wavelength, where a difference between the first wavelength and the second wavelength is less than or equal to the wavelength difference threshold. The wavelength difference threshold may be less than or equal to, for example, 0.1 nm, 0.2 nm, 0.3 nm, 0.5 nm, or 1 nm.

In some implementations, each laser diode 124, of the plurality of laser diodes 124, may be configured to emit a beam associated with a particular polarity. For example, each laser diode 124 may be configured to emit a beam in transverse electric (TE) mode, and therefore each beam may have a polarity associated with a slow axis of the laser diode 124. As another example, a first column of laser diodes, of the row-and-column formation, may be configured to emit beams associated with a first polarity and a second column of laser diodes, of the row-and-column formation, may be configured to emit beams associated with a second polarity, wherein the first polarity and the second polarity are different from each other.

In other implementations, the laser diodes 124 of each column may emit beams in the same polarization and the laser submodule 104 may include a half-wave plate (HWP) 130. The HWP 130 may be configured to receive beams emitted by a particular column of laser diodes 124 of the laser submodule 104 and to convert a polarity of those beams (e.g., between two orthogonal linear polarities) before directing those beams to the PBC 106. For example, as shown in FIG. 1B, the HWP 130 may be configured to receive beams emitted by the set of laser diodes 124 of the right column of the laser submodule 104 (after the beams are collimated by the lenses 126 and directed to the HWP 130 by the reflectors 128 associated with the set of laser diodes 124) and may thereby convert a polarity of those beams (e.g., from a horizontal polarization to a vertical polarization) and direct the beams to the PBC 106.

The laser submodule 104 may be associated with a plurality of lenses 126 and a plurality of reflectors 128. Each lens 126, of the plurality of lenses 126, and each reflector 128, of the plurality of reflectors 128, may be associated with a particular laser diode 124, of the plurality of laser diodes 124. For example, as shown in FIG. 1B, a lens 126 may be configured to collimate a beam that emits from a laser diode 124 and to direct the beam to a reflector 128, which may be configured to reflect the beam to the PBC 106. The lens 126 may be configured to collimate the beam in a particular plane, such as a horizontal plane (e.g., that is parallel to the internal surface of the floor of the laser module 102).

Accordingly, the laser submodule 104 may be configured to emit an array pattern of beams, such as an N×2 row-and-column pattern of beams, to the PBC 106. For example, with respect to FIGS. 1A-1B, the laser submodule 104 may emit an 11×2 pattern of beams to the PBC 106, where a first column of beams of the 11×2 pattern of beams is associated with the set of laser diodes 124 of the right column of the laser submodule 104 and a second column of beams of the 11×2 pattern of beams is associated with the set of laser diodes 124 of the left column of the laser submodule 104. A polarity associated with a column of beams, of the array pattern of beams, may be different than a polarity of another column of beams of the array pattern of beams. For example, with respect to FIG. 1B, a polarity (e.g., a vertical polarity) associated with the first column of beams may be different than a polarity (e.g., a horizontal polarity) associated with the second column of beams (e.g., a polarity associated with the first column of beams may be rotated by 90 degrees as compared to a polarity associated with the second column of beams). Additionally, or alternatively, a row of beams (e.g., two beams), of the array pattern of beams, may be associated with a same wavelength (e.g., the row of beams may be centered at the same wavelength).

The PBC 106 may be located on the laser submodule 104, or on the internal surface of the floor of the laser module 102 and may include a submount. The PBC 106 may be configured to receive the array pattern of beams emitted by the laser submodule 104. In some implementations, the PBC 106 may be configured to combine (e.g., spatially combine, such as using spatial division multiplexing) the array pattern of beams, where each row of the array pattern of beams is combined into a single beam. For example, as shown in FIG. 1B, the PBC 106 may be configured to combine the beams from each row of laser diodes 124 into a vertical stack pattern 132 of beams. Accordingly, each beam in the vertical stack pattern 132 of beam may be associated with a particular wavelength and multiple polarities (e.g., a combination of a first beam centered at the particular wavelength with a horizontal polarity and a second beam centered at the particular wavelength with a vertical polarity). The PBC 106 may be configured to direct the vertical stack pattern 132 of beams to the beam rotator 108.

The beam rotator 108 is attached to the internal surface of the floor of the laser module 102. The beam rotator 108 may be configured to receive the vertical stack pattern 132 of beams from the PBC 106 and to rotate the vertical stack pattern 132 of beams. For example, the beam rotator 108 may be configured to rotate the vertical stack pattern 132 of beams by 90 degrees (e.g., within a tolerance, which may be less than or equal to 1 degree). Accordingly, as shown in FIG. 1B, the beam rotator 108 may rotate the vertical stack pattern 132 of beams into a horizontal stack pattern 134 of beams. The beam rotator 108 may be configured to direct the horizontal stack pattern 134 of beams to the first lens 110.

The first lens 110 is attached to the internal surface of the floor of the laser module 102. The first lens 110 may be configured to receive the horizontal stack pattern 134 of beams from the beam rotator 108 and to converge the horizontal stack pattern 134 of beams (e.g., on the grating 114). For example, the first lens 110 may be a converging lens (e.g., for the horizontal stack pattern 134 of beams propagating from the beam rotator 108 to the grating 114), such as a cylindrical lens (e.g., a cylindrical converging lens), and may be configured to converge the horizontal stack pattern 134 of beams on the grating 114, such as via reflection by the reflector 112. Accordingly, first lens 110 may be configured to direct the horizontal stack pattern 134 of beams to the reflector 112 (e.g., in association with converging the horizontal stack pattern 134 of beams).

The reflector 112 is attached to the internal surface of the floor of the laser module 102. The reflector 112 may be configured to receive the horizontal stack pattern 134 of beams from the first lens 110 and to direct the horizontal stack pattern 134 of beams to the grating 114. For example, the reflector 112 may be a turning mirror that is configured to change a propagation direction of the horizontal stack pattern 134 of beams such that the horizontal stack pattern 134 of beams are directed to the grating 114. The reflector 112 may be optional, its inclusion enabling folded optical path for a more compact laser module 102.

The grating 114 is attached to the internal surface of the floor of the laser module 102. The grating 114 is attached to the internal surface of the floor of the laser module 102. The grating 114 (e.g., a diffractive grating, a transmission grating, a diffractive transmission grating, or another type of grating) may be configured to receive the horizontal stack pattern 134 of beams from the reflector 112 and to combine (e.g., using wavelength beam combining (WBC)) the horizontal stack pattern of beams into an overlapped pattern 136 of beams. As shown in FIG. 1B, the overlapped pattern 136 of beams may be a single beam (e.g., that is a combination of each beam in the horizontal stack pattern 134 of beams). The single beam may have high power (e.g., a combination of respective powers of the beams in the horizontal stack pattern 134). The grating 114 may be configured to direct the overlapped pattern 136 of beams (e.g., as the single beam) to the second lens 118 (e.g., via the OC 116).

The OC 116 is attached to the internal surface of the floor of the laser module 102. The OC 116 may be configured to receive the overlapped pattern 136 of beams (e.g., as the single beam) from the grating 114 and to reflect a first portion of the overlapped pattern 136 of beams back to the laser submodule 104 (e.g., in a reverse propagation direction via the grating 114, the reflector 112, the first lens 110, the beam rotator 108, and the PBC 106). The first portion of the overlapped pattern 136 of beams may include less than or equal to a particular percentage of the overlapped pattern 136 of beams, wherein the particular percentage is, for example, less than or equal to 1%, 5%, and/or 10%. In this way, respective portions of the beams emitted by the plurality of laser diodes 124 may be reflected back to the plurality of laser diodes 124 to cause the plurality of laser diodes 124 to be wavelength-locked. For example, a particular laser diode 124 may emit a particular beam associated with a particular wavelength, which may propagate to the OC 116 as part of the overlapped pattern 136 of beams (in a similar manner as described elsewhere herein). The OC 116 may reflect a portion of the overlapped pattern 136 of beams, which includes a portion of the particular beam. This causes the particular portion of the particular beam to propagate to the particular laser diode 124 and thereby causes the particular laser diode 124 to be wavelength-locked at the particular wavelength.

Additionally, or alternatively, as shown in FIG. 1B, the OC 116 may be configured to direct a second portion of the overlapped pattern 136 of beams (e.g., as a single beam) to the second lens 118. For example, the OC 116 may be configured to direct a remainder of the overlapped pattern 136 of beams (e.g., that is not reflected by the OC 116) to the second lens 118.

The second lens 118 is attached to the internal surface of the floor of the laser module 102. The second lens 118 may be configured to receive the second portion of the overlapped pattern 136 of beams (e.g., as the single beam) from the OC 116 to converge the second portion of the overlapped pattern 136 of beams (e.g., in a particular direction). For example, the second lens 118 may be a converging lens (e.g., for the second portion of the overlapped pattern 136 of beams propagating from the OC 116 to the third lens 120), such as a cylindrical fast axis coupling (CFAC) lens, and may be configured to converge the second portion of the overlapped pattern 136 of beams (e.g., in a fast axis associated with the plurality of laser diodes 124) on the third lens 120. Accordingly, as shown in FIG. 1B, the second lens 118 may direct the second portion of the overlapped pattern 136 of beams to the third lens 120.

The third lens 120 is attached to the internal surface of the floor of the laser module 102. The third lens 120 may be configured to receive the second portion of the overlapped pattern 136 of beams (e.g., as the single beam) from the second lens 118 to converge the second portion of the overlapped pattern 136 of beams (e.g., in another particular direction). For example, the second lens 118 may be a converging lens (e.g., for the second portion of the overlapped pattern 136 of beams propagating from the second lens 118 to the output fiber 122), such as a cylindrical slow axis coupling (CSAC) lens, and may be configured to converge the second portion of the overlapped pattern 136 of beams (e.g., in a slow axis associated with the plurality of laser diodes 124) on the output fiber 122. Accordingly, as shown in FIG. 1B, the second lens 118 may direct the second portion of the overlapped pattern 136 of beams to the output fiber 122. The second portion of the overlapped pattern 136 of beams may converge on the output fiber 122 as a focused dot.

The third lens 120 is attached to the internal surface of the floor of the laser module 102. The output fiber 122 may be configured to receive the second portion of the overlapped pattern 136 of beams from the third lens 120 and to emit the second portion of the overlapped pattern 136 of beams (e.g., as single beam) from the laser module 102. For example, the output fiber 122 may emit the second portion of the overlapped pattern 136 (e.g., as a single beam) to another fiber (e.g., of a fiber laser), to a target (e.g., a workpiece associated with a laser processing task, such as cutting, drilling, welding, brazing, surface annealing, alloying, and/or hardening), or another type of target.

In some implementations, the vertical stack pattern 132 of beams, the horizontal stack pattern 134 of beams, and the overlapped pattern 136 of beams may transmit through the laser module 102 parallel to a particular plane, such as a horizontal plane (e.g., that is parallel to the internal surface of the floor of the laser module 102).

FIG. 1C shows a side view of the laser module 102 (e.g., a side view of the internal environment of the laser module 102). As shown in FIG. 1C, each of the laser submodule 104, the PBC 106, the beam rotator 108, the first lens 110, the reflector 112, the grating 114, the OC 116, the second lens 118, the third lens 120, and the output fiber 122 are attached to the internal surface of the floor of the laser module 102 (and not attached to an internal surface of a side or ceiling of the laser module 102). Accordingly, these components are aligned in a single common plane (e.g., that is parallel to the internal surface of the floor of the laser module 102). As further shown in FIG. 1C, the plurality of laser diodes 124 may be arranged on a staircase structure 138 (e.g., as described elsewhere herein). In some embodiments, the floor of the laser module 102 may be an optical bench attached to the bottom of the laser module 102 and, accordingly, the internal surface of the floor of the laser module 102 may be a surface of an optical bench. In such embodiments, the optical bench provides a single common plane for attachment and alignment of components.

FIGS. 1A-1C are provided as an example. Other examples may differ from what is described with regard to FIGS. 1A-1C.

Figure 2:
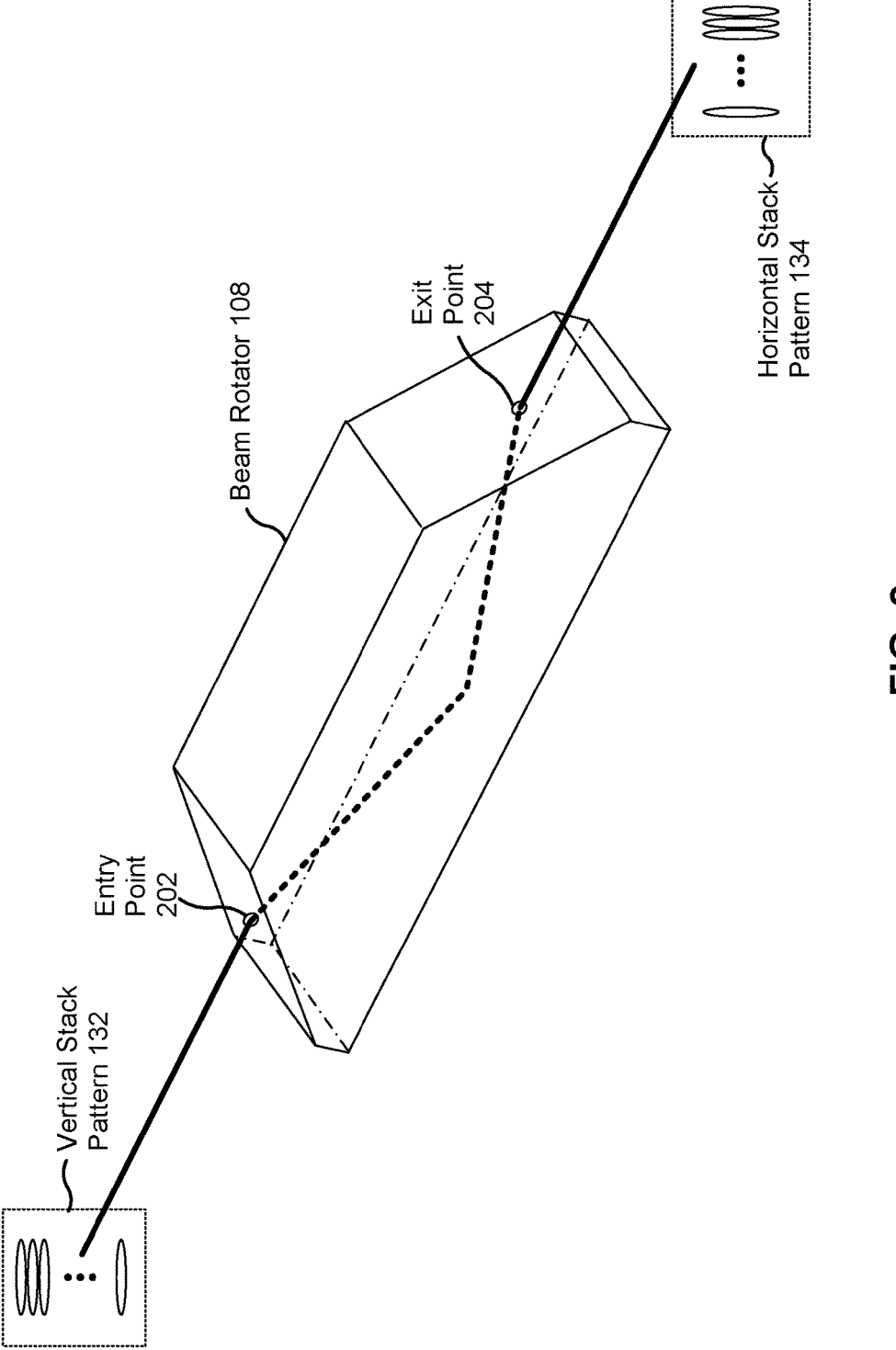
FIG. 2 is a diagram of an example beam rotator described herein.

FIG. 2 is a diagram 200 of an example beam rotator described herein. As shown in FIG. 2, the beam rotator 108 may be configured to receive the vertical stack pattern 132 of beams (e.g., from the PBC 106) at the entry point 202 of the beam rotator 108. Accordingly, the beam rotator 108 may be configured (e.g., the beam rotator may be shaped and/or may have one or more angled surfaces) to cause the beams to rotate (e.g., by transmitting through the beam rotator 108). For example, as shown in FIG. 2, the beam rotator 108 may rotate the vertical stack pattern 132 of beams into a horizontal stack pattern 134 of beams, which may exit from the beam rotator 108 at the exit point 204 of the beam rotator 108. The beam rotator 108 may thereby direct the horizontal stack pattern 134 of beams from the beam rotator 108 (e.g., to the first lens 110). The beam rotator 108 may be, for example, a Dove prism beam rotator, which has a reduced manufacturing complexity and a reduced insertion loss as compared to other beam rotation components, such as a beam twister system (BTS).

FIG. 2 is provided as an example. Other examples may differ from what is described with regard to FIG. 2.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

In some implementations, optical elements of the laser module may be combined into a same physical element (e.g., reflector 112 and first lens 110 may be combined into a reflective lens) or optical elements of the laser module may be divided into multiple physical elements (e.g. lenses 126 may comprise separate fast and slow axis lenses).

What is claimed is:

1. A laser module comprising:
a laser submodule attached to an internal surface of a floor of the laser module;
a polarization beam combiner (PBC) attached to the internal surface of the floor;
a beam rotator attached to the internal surface of the floor;
a first lens attached to the internal surface of the floor;
a reflector attached to the internal surface of the floor;
a grating attached to the internal surface of the floor;

a second lens attached to the internal surface of the floor;
a third lens attached to the internal surface of the floor; and
an output fiber attached to the internal surface of the floor, wherein:
the laser submodule includes a plurality of laser diodes arranged in a row-and-column formation,
a row in the row-and-column formation includes a first laser diode of the plurality of laser diodes and a second laser diode of the plurality of laser diodes,
a column in the row-and-column formation includes the first laser diode and a third laser diode of the plurality of laser diodes,
the first laser diode is configured to emit a first beam associated with a first wavelength and a first polarization,
the second laser diode is configured to emit a second beam associated with the first wavelength and a second polarization different than the first polarization,
the third laser diode is configured to emit a third beam associated with a second wavelength, different than the first wavelength, and the first polarization,
the laser submodule is configured to emit an array pattern of beams, including the first beam, the second beam, and the third beam, having different polarizations, including the first polarization and the second polarization, to the PBC,
the PBC is configured to combine the array pattern of beams into a vertical stack pattern of beams,
the beam rotator is configured to rotate the vertical stack pattern of beams into a horizontal stack pattern of beams,
the first lens and the reflector are configured to direct the horizontal stack pattern of beams to the grating,
the grating is configured to combine the horizontal stack pattern of beams into an overlapped pattern of beams and to direct the overlapped pattern of beams to the second lens,
the second lens is configured to direct the overlapped pattern of beams to the third lens,
the third lens is configured to direct the overlapped pattern of beams to the output fiber, and
the vertical stack pattern of beams, the horizontal stack pattern of beams, and the overlapped pattern of beams are to transmit through the laser module parallel to the internal surface of the floor of the laser module.

2. The laser module of claim 1, wherein:
the row is a first row of laser diodes configured to emit beams associated with the first wavelength;
a second row of laser diodes, of the row-and-column formation, are configured to emit beams associated with the second wavelength; and
a difference between the first wavelength and the second wavelength is less than or equal to 0.3 nm.

3. The laser module of claim 1,
wherein the plurality of laser diodes are arranged on a staircase structure, and
wherein each laser diode, in a row of the row-and-column formation, is arranged at a same step height in the staircase structure.

4. The laser module of claim 3,
wherein each step, of the staircase structure, is parallel to the internal surface of the floor of the laser module.

5. The laser module of claim 1, wherein the column is a first column of laser diodes configured to emit beams associated with the first polarization, and wherein a second column of laser diodes, of the row-and-column formation, are configured to emit beams associated with the second polarization.

6. The laser module of claim 1, further comprising a half-wave plate (HWP), wherein the HWP is configured to convert a polarization of beams emitted by a column of laser diodes, of the row-and-column formation, and direct the beams to the PBC as part of the laser submodule emitting the array pattern of beams having different polarizations to the PBC.

7. The laser module of claim 1, further comprising an output coupler (OC), wherein the OC is further configured to reflect a portion of the overlapped pattern of beams to the laser submodule, wherein reflecting the portion of the overlapped pattern of beams to the laser submodule is to cause the plurality of laser diodes of the laser submodule to be wavelength-locked.

8. A laser module comprising:

a laser submodule attached to an internal surface of a floor of the laser module;

a polarization beam combiner (PBC) attached to the internal surface of the floor;

a beam rotator attached to the internal surface of the floor;

a grating attached to the internal surface of the floor; and an output fiber attached to the internal surface of the floor, wherein:

the laser submodule includes a plurality of laser diodes arranged in a row-and-column formation, a row in the row-and-column formation includes a first laser diode of the plurality of laser diodes and a second laser diode of the plurality of laser diodes, a column in the row-and-column formation includes the first laser diode and a third laser diode of the plurality of laser diodes, the first laser diode is configured to emit a first beam associated with a first wavelength and a first polarization, the second laser diode is configured to emit a second beam associated with the first wavelength and a second polarization different than the first polarization, the third laser diode is configured to emit a third beam associated with a second wavelength, different than the first wavelength, and the first polarization, the laser submodule is configured to emit an array pattern of beams having different polarizations to the PBC, the PBC is configured to combine the array pattern of beams into a vertical stack pattern of beams, the beam rotator is configured to rotate the vertical stack pattern of beams into a horizontal stack pattern of beams, the grating is configured to combine the horizontal stack pattern of beams into an overlapped pattern of beams and to direct the overlapped pattern of beams to the output fiber, and the output fiber is configured to emit the overlapped pattern of beams from the laser module and to a target, and the vertical stack pattern of beams, the horizontal stack pattern of beams, and the overlapped pattern of beams are to transmit through the laser module parallel to the internal surface of the floor of the laser module.

9. The laser module of claim 8, wherein the grating is configured to combine the horizontal stack pattern of beams into the overlapped pattern of beams.

10. The laser module of claim 8, further comprising an output coupler (OC), wherein the OC is configured to direct a portion of the overlapped pattern of beams to the laser submodule to wavelength-lock laser diodes of the laser submodule.

11. The laser module of claim 8, wherein the plurality of laser diodes are arranged on a staircase structure, and wherein each laser diode, in a row of the row-and-column formation, is arranged at a same step height of the staircase structure.

12. The laser module of claim 8, wherein the column is a first column of laser diodes configured to emit beams associated with the first polarization, and wherein a second column of laser diodes, of the row-and-column formation, are configured to emit beams associated with the second polarization.

13. The laser module of claim 8, further comprising a half-wave plate (HWP), wherein the HWP is configured to convert a polarization of beams emitted by a column of laser diodes, of the row-and-column formation, and direct the beams to the PBC as part of the laser submodule emitting the array pattern of beams having different polarizations to the PBC.

14. The laser module of claim 8, wherein:

the row is a first row of laser diodes configured to emit beams associated with the first wavelength;

a second row of laser diodes, of the row-and-column formation, are configured to emit beams associated with the second wavelength; and a difference between the first wavelength and the second wavelength is less than or equal to 0.3 nm.

15. A laser module comprising:

a laser submodule attached to an internal surface of a floor of the laser module;

a polarization beam combiner (PBC) attached to the internal surface of a floor of the laser module;

a beam rotator attached to the internal surface of the floor; and a grating attached to the internal surface of the floor, wherein:

the laser submodule includes a plurality of laser diodes arranged in a row-and-column formation, a row in the row-and-column formation includes a first laser diode of the plurality of laser diodes and a second laser diode of the plurality of laser diodes, a column in the row-and-column formation includes the first laser diode and a third laser diode of the plurality of laser diodes, the first laser diode is configured to emit a first beam associated with a first wavelength and a first polarization, the second laser diode is configured to emit a second beam associated with the first wavelength and a second polarization different than the first polarization, the third laser diode is configured to emit a third beam associated with a second wavelength, different than the first wavelength, and the first polarization, the laser submodule is configured to emit an array pattern of beams having different polarizations to the PBC, the PBC is configured to combine the array pattern of beams into a vertical stack pattern of beams, the beam rotator is configured to rotate the vertical stack pattern of beams into a horizontal stack pattern of beams, the grating is configured to combine the horizontal stack pattern of beams into an overlapped pattern of beams and to direct the overlapped pattern of beams to an output fiber of the laser submodule, and the vertical stack pattern of beams, the horizontal stack pattern of beams, and the overlapped pattern of beams are to transmit through the laser module parallel to the internal surface of the floor of the laser module.

16. The laser module of claim 15, wherein the laser submodule, the PBC, the beam rotator, and the grating are only attached to the internal surface of the floor of the laser module.

17. The laser module of claim 15, further comprising an output coupler (OC), wherein the OC is configured to direct a portion of the overlapped pattern of beams to the laser submodule to wavelength-lock laser diodes of the laser submodule.

18. The laser module of claim 15, wherein:

the row is a first row of laser diodes configured to emit beams associated with the first wavelength;

a second row of laser diodes, of the row-and-column formation, are configured to emit beams associated with the second wavelength; and a difference between the first wavelength and the second wavelength is less than or equal to 0.3 nm.

19. The laser module of claim 15, wherein the column is a first column of laser diodes configured to emit beams associated with the first polarization, and wherein a second column of laser diodes, of the row-and-column formation, are configured to emit beams associated with the second polarization.

20. The laser module of claim 15, further comprising a half-wave plate (HWP), wherein the HWP is configured to convert a polarization of beams emitted by a column of laser diodes, of the row-and-column formation, and direct the beams to the PBC as part of the laser submodule emitting the array pattern of beams having different polarizations to the PBC.

\* \* \* \* \*